United States Patent [19]

Mariner et al.

[11] Patent Number: 5,495,550
[45] Date of Patent: Feb. 27, 1996

[54] GRAPHITE FLASH EVAPORATOR HAVING AT LEAST ONE INTERMEDIATE LAYER AND A PYROLYTIC BORON NITRIDE COATING

[75] Inventors: John T. Mariner, Avon Lake; Douglas A. Longworth, Cleveland Hts., both of Ohio

[73] Assignee: Advanced Ceramics Corporation, Cleveland, Ohio

[21] Appl. No.: 314,314

[22] Filed: Sep. 28, 1994

[51] Int. Cl.⁶ ..................................................... C23C 14/26
[52] U.S. Cl. ........................... 392/389; 118/726; 432/264
[58] Field of Search ....................................... 392/388, 389, 392/391; 432/4, 44, 265, 156, 263, 264; 219/425, 427, 426; 427/255.7; 118/726

[56] References Cited

U.S. PATENT DOCUMENTS

| | | | |
|---|---|---|---|
| 3,537,886 | 11/1970 | Rively et al. | 219/427 |
| 3,539,769 | 11/1970 | Barker | 219/427 |
| 4,058,579 | 11/1977 | Lashway | 427/255.7 |
| 4,112,290 | 9/1978 | Nakajima et al. | 392/389 |
| 4,264,803 | 4/1981 | Shinko | 219/275 |
| 4,446,357 | 5/1984 | Barshter | 392/389 |
| 4,773,852 | 9/1988 | Tanji et al. | 432/265 |
| 5,158,750 | 10/1992 | Finicle | 432/265 |
| 5,239,612 | 8/1993 | Morris | 392/389 |
| 5,343,022 | 8/1994 | Gilbert, Sr. et al. | 392/389 |

OTHER PUBLICATIONS

IBM Technical Disclosure Bulletin vol. 27 No. 1A Jun. 1984 Cosgrove, J. F. et al. Titanium Evaporation Source.

Primary Examiner—Terry J. Owens
Attorney, Agent, or Firm—Eugene Lieberstein; Michael N. Meller

[57] ABSTRACT

A flash evaporator vaporization vessel for flash evaporating metal under conditions of repeated thermal cycling having a graphite body, an outer layer of pyrolytic boron nitride and an intermediate layer of a material selected from the group consisting of pyrolytic graphite, boron carbide ($B_4C$), tantalum carbide, and silicon carbide and having a thickness of no greater than about 0,002 inches.

4 Claims, 1 Drawing Sheet

GRAPHITE FLASH EVAPORATOR HAVING AT LEAST ONE INTERMEDIATE LAYER AND A PYROLYTIC BORON NITRIDE COATING

FIELD OF INVENTION

This invention relates to a resistance heated flash evaporator for the flash vaporization of metals and more particularly to a flash evaporator vaporization vessel composed of a graphite body and a pyrolytic boron nitride outer coating.

BACKGROUND OF THE INVENTION

Vacuum deposition is a common method for coating metals such as aluminum, copper, zinc, and tin onto various substrates of metal, glass and plastic. The metal is vaporized in a vessel commonly referred to as a "vaporization boat" by electric resistance heating. The vessel is connected to a source of electrical power to heat the vessel to a temperature which will cause the metal charge in contact with the boat to vaporize. Typically, the product is placed in an evacuated chamber within which the metal is vaporized. The product may be fed individually or continuously into the chamber or, alternatively, may form part of the chamber itself. A wide variety of product is coated with metal using vapor deposition including, e.g., television picture tubes, automobile headlights, toys and the like.

The metal charge is placed in a cavity recess machined into the top surface of the vessel. Upon reaching the vaporization temperature of the metal the metal charge melts and quickly vaporizes. The charge flashes in a vigorous and abrupt manner and the process is repeated with a new charge of metal. The number of flashes which can be performed in a given time period controls product production. Accordingly, the number of flashes a vessel can sustain without failure is a critical performance characteristic of the process. Conversely, when failure occurs the parts being coated are scrapped or have to be redone which involves additional time and cost. To avoid this extra cost the vaporization vessel may be discarded before anticipated failure. A vaporization vessel with a short lifetime increases the production cost per part and reduces efficiency.

SUMMARY OF THE INVENTION

A method of resistance heating of metal using a flash evaporator composed of a pyrolytic born nitride coated graphite body is taught in U.S. Pat. No. 5,239,612 the disclosure of which is herein incorporated by reference. As described in the aforementioned patent the coating of pyrolytic boron nitride (hereinafter "PBN") may be formed by the vapor phase reaction of ammonia and a boron halide such as boron trichloride.

It has been discovered in accordance with the present invention that the useful life of the vaporization boat may be extended by the incorporation of an intermediate layer between the PBN coating and the graphite body which will provide separation between the graphite and the PBN and allow for a relatively wide latitude of mismatch in the coefficient of thermal expansion "CTE" between the graphite body and the PBN coating upon repeated thermal cycling. An intermediate layer of pyrolytic graphite which is of minimal thickness, preferably between about 0.0002 and 0.002 inches thick, is preferred. Other materials which can be substituted for pyrolytic graphite include metal carbides selected from the group consisting of boron carbide ($B_4C$), tantalum carbide, and silicon carbide.

The flash evaporator vaporization vessel of the present invention comprises: a graphite body having a recessed cavity in which the metal to be vaporized is introduced, an outer pyrolytic boron nitride coating for said graphite body and at least one intermediate layer separating said pyrolytic boron nitride coating from said graphite body within said recessed cavity with said intermediate layer composed of a material selected from the group consisting of: pyrolytic graphite, boron carbide ($B_4C$), tantalum carbide, and silicon carbide and having a thickness of no greater than about 0.002 inches.

BRIEF DESCRIPTION OF THE DRAWINGS

Other advantages of the present invention will become apparent from the following detailed description of the invention when read in conjunction with the accompanying drawings of which.

DETAILED DESCRIPTION OF THE INVENTION

Figures 1, 2:
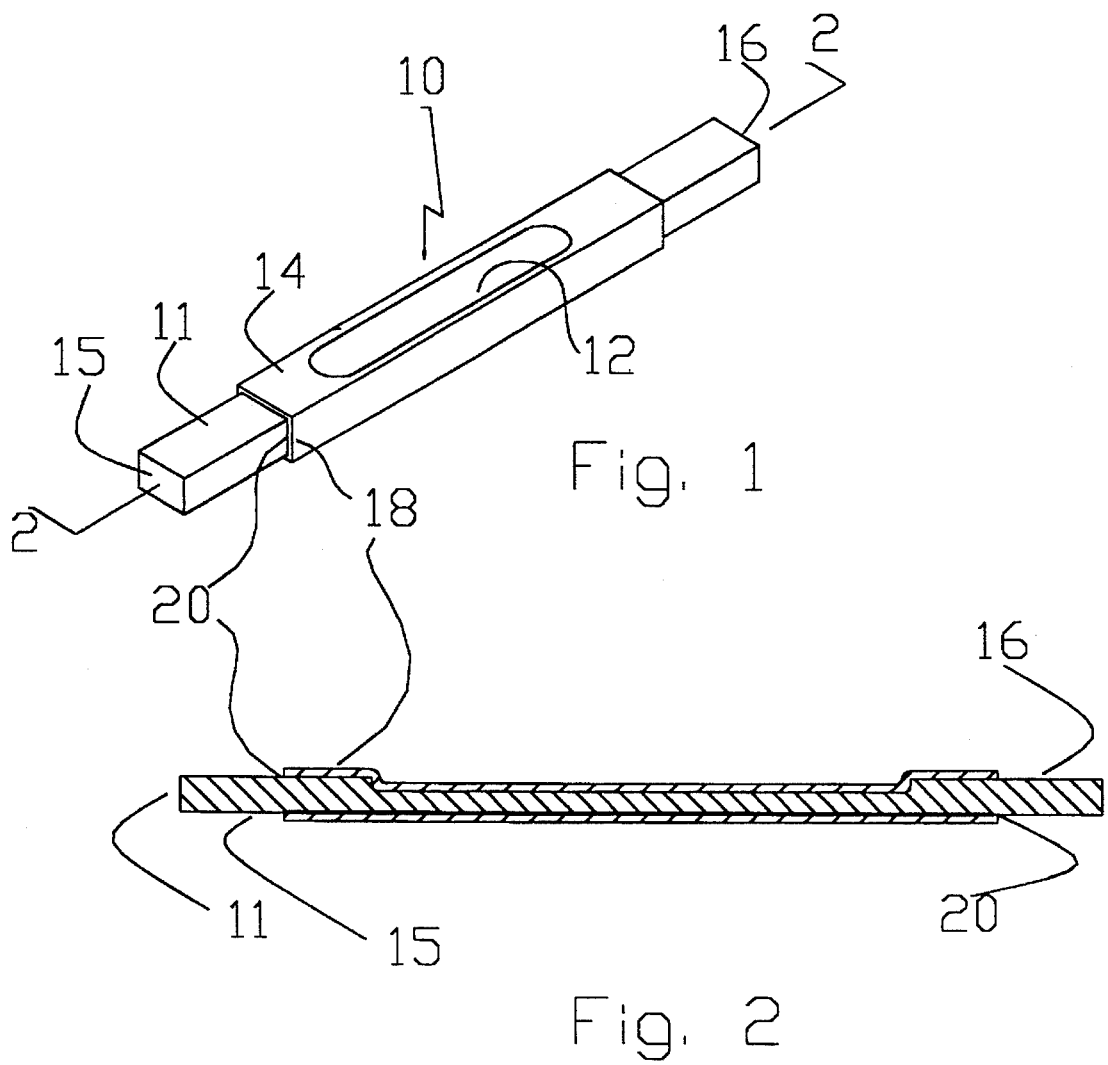
FIG. 1 is an isometric view of the vaporization vessel of the present invention.
FIG. 2 is a cross section taken along the lines 2—2 of FIG. 1.

A vaporization boat 10 of the resistance type require a precise shape to match the resistance circuit. It is usually made long and narrow as is shown in FIG. 1 with a cavity or depression 12 machined into the body 11 on at least one surface 14. The body 11 is formed from a block of graphite preferably of high density and high strength and is coated with a thin layer of pyrolytic boron nitride. The process for coating boron nitride is conventional and briefly involves introducing vapors of ammonia and a gaseous boron halide in a suitable ratio into a heated furnace reactor containing the graphite body with the furnace maintained at a controlled temperature of between 1800° C. to 2200° C. The coating 18 of pyrolytic boron nitride "PBN" is usually no thicker than 0.030 inches and fully encapsulates the graphite body 11 except for the ends 15 and 16 where the coating is machined off to expose the graphite for making an electrical connection with the clamp assembly.

In accordance with the present invention an intermediate layer 20 is formed between the graphite body 11 and the pyrolytic boron nitride coating 18 to improve the life and thermal uniformity of the boat 10 when subjected to repeated thermal cycling. The intermediate layer 20 is formed prior to coating the graphite body 11 with PBN and is preferably formed by chemical vapor deposition. The thickness of the intermediate layer 20 is an important characteristic of the present invention and should have a thickness of no greater than about 0.002 inches and preferably in a thickness range of between 0.0002 and 0.001 inches. The intermediate layer 20 functions to allow a relatively wide latitude of mismatch between the coefficient of thermal expansion of the PBN layer 18 and that of the graphite body 11. This is accomplished by allowing the PBN layer to be less bonded to the underlying graphite body. The intermediate layer 20 should also be anisotropic and promote thermal uniformity. The preferred material for the intermediate layer is pyrolytic graphite. Other materials which can be substituted for pyrolytic graphite include metal carbides selected from the group consisting of boron carbide ($B_4C$), tantalum carbide, and silicon carbide. The term "pyrolytic graphite" is hereby defined to mean a crystalline carbonaceous structure in which there is a high degree of crystallite orientation. Crystalline orientation is not found in common graphite material. Additionally, pyrolytic graphite exhibits anisotropic physical properties due to its being characterized by oriented slip planes in contrast to isotropic properties of common graphite. Pyrolytic graphite may be formed by chemical vapor decomposition of, for example, methane gas at high temperature in a reactor chamber with a suitable inert diluent.

The coefficient of thermal expansion "CTE" of PBN and graphite is not necessarily linear with temperature and the percent expansion at a typical operating condition of 1500° C. PBN has a percent expansion of 0.4% to 0.5% for most commercially used densities whereas graphite has a minimum percent expansion of 0.6% and many grades can be much higher. The use of the intermediate layer 20 prevents premature failure due to repeated thermal cycling.

The high degree of anisotrophy makes pyrolytic graphite the preferred choice as the intermediate layer separating medium between the graphite body 11 and the PBN outer coating 18. However the intermediate layer 20 must be sufficiently thin so that its coefficient of thermal expansion does not play a material role during the repeated thermal cycling. A thin layer of pyrolytic graphite 20 deposited on the surface of the graphite body before coating with PBN will also even out any local hot spots. Thermal conductivities parallel to the surface of the thin layer are typically 700 watt/meter-degK, around 200 times greater than the conductivity through the thickness of the thin layer, typically 3.5 watts/meter-degK.

The thickness of the PG layer 20 will provide different amounts of separation between the graphite body 11 and the PBN layer 18 and will provide different degrees of thermal leveling. Other materials may also be used as a substitute for PG or a composite of thin layers of PG and/or such other materials such as a metal carbide selected from the group consisting of boron carbide ($B_4C$), tantalum carbide, and silicon carbide.

What we claim is:

1. A flash evaporator vaporization vessel for flash evaporating metal under repeated thermal cycling conditions comprising: a graphite body having a recessed cavity in which the metal to be vaporized is introduced, an outer pyrolytic boron nitride coating for said graphite body and at least one intermediate layer separating said pyrolytic boron nitride coating from said graphite body with said intermediate layer composed of a material selected from the group consisting of: pyrolytic graphite, boron carbide ($B_4C$), tantalum carbide, and silicon carbide and having a thickness of no greater than about 0.002 inches.

2. A flash evaporator as defined in claim 1 wherein said intermediate layer is composed of pyrolytic graphite.

3. A flash evaporator as defined in claim 2 wherein said intermediate layer has a thickness in the range of between 0.0002 inches and 0.002 inches.

4. A flash evaporator as defined in claim 1 wherein the intermediate layer is composed of a plurality of thin layers having an overall thickness of no greater than about 0.002 inches.

* * * * *